United States Patent [19]
Saito

[11] Patent Number: 5,548,265
[45] Date of Patent: Aug. 20, 1996

[54] THIN FILM MAGNETIC ELEMENT

[75] Inventor: Akira Saito, Kawasaki, Japan

[73] Assignee: Fuji Electric Co., Ltd., Kawasaki, Japan

[21] Appl. No.: 313,933

[22] Filed: Apr. 11, 1994

Related U.S. Application Data

[62] Division of Ser. No. 25,422, Mar. 1, 1993, Pat. No. 5,355,301.

[30] Foreign Application Priority Data

Feb. 28, 1992 [JP] Japan ................... 4-043607

[51] Int. Cl.⁶ ......................................... H01F 5/02
[52] U.S. Cl. ........................................ 336/200; 336/232
[58] Field of Search ........................ 336/200, 232

[56] References Cited

U.S. PATENT DOCUMENTS

| | | | |
|---|---|---|---|
| 4,785,345 | 11/1988 | Rawles et al. | 357/51 |
| 4,959,631 | 9/1990 | Hasegawa et al. | 336/83 |
| 4,993,209 | 6/1990 | Anthony et al. | 427/116 |
| 5,097,243 | 3/1992 | Zieren et al. | 336/200 |

*Primary Examiner*—Laura Thomas
*Attorney, Agent, or Firm*—Kanesaka & Takeuchi

[57] ABSTRACT

A thin-film magnetic element is formed of a substrate, a first thin film coil made of a conductive material and formed in a spiral shape on the surface of the substrate parallel thereto, and a second thin-film coil made of a conductive material and formed in a spiral shape on the first thin-film coil parallel to the substrate. The first thin-film coil and the second thin-film coil occupy nearly the same position relative to the substrate surface. Each of the first and second thin film coils changes a line width from an inner circumference to an outer circumference, and a changing ratio of the line width at the first thin film coil is different from that at the second thin film coil. The spiral shapes of the first and second thin-film coils are shifted slightly away from each other in a direction parallel to the substrate surface.

5 Claims, 9 Drawing Sheets

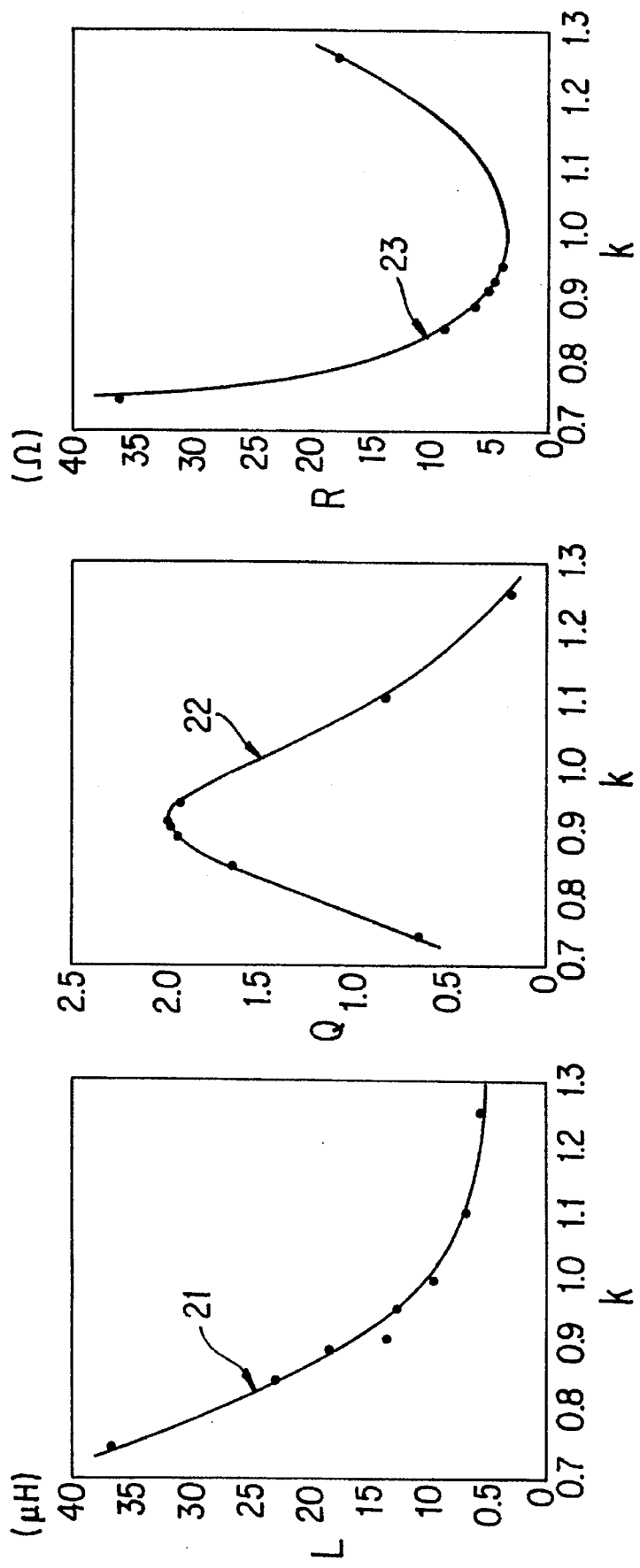

THIN FILM MAGNETIC ELEMENT

CROSS REFERENCE TO RELATED APPLICATION

This is a divisional application of patent application Ser. No. 08/025,422 filed on Mar. 1, 1993, now U.S. Pat. No. 5,355,301.

BACKGROUND OF THE INVENTION AND RELATED ART STATEMENT

The present invention relates to an extremely small one-chip switching power supply device formed of magnetic inductive elements, such as a transformer with a thin-film laminated construction and a reactor mounted on a semiconductor chip.

Switching power supply devices used widely as DC constant voltage power supply or stabilized power supply devices for electronic devices include a variety of circuitries, such as so-called forward-type, flyback-type and chopper-type devices. In the above systems, the input side and the output side are linked via magnetic inductive elements and devices, such as a transformer and an inductor, and a direct voltage on the output side is maintained constant at all times while turning on and off the input side current in the magnetic induction elements by switching elements such as transistors and controlling the duty ratio.

Since these switching power supply devices require rectification diodes, smoothing capacitors and controlling integrated circuit devices in addition to such magnetic induction elements and switching elements as described above, these circuit parts have all been mounted normally on a printed wiring substrate. However, as electronic devices continue to enlarge in scale and become more complex, wherein switching power supply devices with small capacities from several watts to ten watts are incorporated in electronic circuits for constituting such devices, switching power supplies that are as small and as inexpensive as possible have been in demand.

To meet such a demand, recent advanced high integration techniques can be utilized to incorporate all the semiconductor elements required in the switching power supply devices including switching elements and rectification diodes, in addition to the conventional control circuits into one single chip as small as 10 mm square or less in an integrated circuit device. In addition, the size of the magnetic induction elements and the smoothing capacitors can be decreased to nearly half of that in the conventional products by raising the switching frequencies for the circuit operation to several hundred kHz or higher, while elevating their effective reactance value.

Rationalization of the switching power supply devices has been previously advanced by integrating semiconductor elements and active elements on a single chip, and reducing the sizes of the transformers and smoothing capacitors by raising the switching frequencies as described above. However, these methods of solving the existing problems are approaching to their limit in terms of performance and reliability as explained below.

That is, even if the constituent parts are reduced in size and the number of parts is reduced, the way they are mounted on a printed wiring substrate is still the same. The mounting process is not eliminated even if the number of parts is reduced. Rather, the mounting work becomes more difficult as the parts become smaller, and hence the amount of labor actually required does not change much. In addition, since the active elements are connected to the passive elements via the wiring on the printed substrate, if the switching frequency exceeds 1 MHz, the device performance tends to vary because the circuit operation is affected by the wiring inductance, and the device tends to malfunction more easily because of incoming noise picked up by the wiring. Hence, the device reliability decreases. As a result, it is difficult to raise the switching frequency to about 1 MHz.

Another problem is that, when the switching frequency exceeds 1 MHz, the frequency characteristics of the magnetic inductive elements deteriorate to cause a saturation of the inductance value. That is, while it is possible to draw out an output in proportion to the square root of the frequency from the magnetic inductive elements with a certain size in a frequency region near 100 k Hz, and to obtain a reactance value proportional to the frequency, high-frequency loss increases in the magnetic circuits of the magnetic inductive elements in a high frequency region greater than 1 MHz, and the electrostatic capacity distributed internally increases. Therefore, since the frequency characteristic in the inductance value gradually deteriorates, and the reactance value which is a multiplicity of the inductance value and the angular frequency is saturated in a high frequency region greater than 10 MHz and increases very little, it becomes impossible to reduce the size of the magnetic inductive elements beyond a certain limit.

Still another problem is that, as the switching frequency increases, the high frequency loss in the switching element also increases. For example, the analysis results of losses in a switching power supply device of a flyback type operated at a switching frequency of 1 MHz indicate that the loss in the switching element accounted for 35% of the total loss, while the magnetic inductive element accounted for 20%, and other parts accounted for the remaining 45%. Meanwhile, the loss in the switching element is the largest, and this tends to form a bottleneck as the frequency is raised.

The present invention is intended to overcome such limits or the formation of the bottleneck, while providing a switching power supply device that is capable of further reducing the size and ensuring a high conversion efficiency.

SUMMARY OF THE INVENTION

The above objects can be achieved according to the present invention by a one-chip switching power supply device that has a voltage-converting section formed of a magnetic inductive element with a thin-film structure, a switching element to turn the input current of the voltage-converting section on and off, and a voltage-controlling section to control the switching element so that the output side voltage in the voltage-converting section is kept constant at the desired value, wherein an active element containing the switching element and the circuit elements in the voltage-controlling section is incorporated in a single semiconductor chip, and a wiring layer connecting the active elements on the semiconductor chip and the voltage-converting section connected thereto is laminated sequentially via insulation films.

While the circuitry of the switching power supply device with the above construction may be used either for forward-type, flyback-type or chopper-type systems, it is especially advantageous to use flyback transformers in the magnetic inductive elements of the voltage converting section to keep the constant voltage performance of the output side voltage high, and to simplify the entire construction. It is also advantageous to use insulated gate-controlling elements, such as field-effect transistors and insulated-gate bipolar transistors to provide insulation across the input and the output. It is especially advantageous to use a frequency of 1 MHz or higher, more preferably 10 MHz or higher, as a switching frequency to turn the input side current in the voltage-converting section on and off when reducing the size of the device. It is also recommended that, when incorporating capacitors in the device to smooth the output voltage, the capacitors are built into a wiring layer by utilizing a wiring aluminum film or an insulation film.

Furthermore, in order to reduce the high frequency loss in the switching element and raise the conversion efficiency of the device, it is advantageous to split at least the input side of the voltage-converting section into two or more sections to independently turn the input side current flowing through each split input section on and off using the switching elements commonly controlled by the voltage controlling section. In this case, it is possible to split only the input side into two or more sections while the magnetic inductive elements in the voltage-controlling section can remain as a single part. However, it is more advantageous to dispose various magnetic inductive elements so that the switching element will turn its input side current on and off independently, and moreover, connect the various magnetic inductive elements in series at their output side to draw out the output side voltage, thereby strengthening the magnetic bond between the input side and the output side.

When various magnetic inductive elements are to be arranged, it is necessary to make each element as small as possible. To achieve this objective, it is advantageous to split the thin-film conductors on the input side and the output side into two or more layers (usually two) in the vertical direction, when reducing the area of each magnetic inductive element, reducing the crossing points between the thin-film conductors, and raising the magnetic bond coefficient between the input side and the output side when connecting in series the output sides of the various magnetic inductive elements in which the amount of winding on each magnetic inductive element varies considerably.

The thin-film conductors used as the magnetic inductive elements in the coils of transformers and reactors should be set in a spiral or zigzag form to raise the area efficiency. In particular, the latter pattern has an advantage in that it reduces the high frequency loss in a magnetic circuit, while because it is constructed simply, the former is especially advantageous for strengthening the magnetic bond between the input side coil and the output side coil in a transformer to raise the output that can be drawn out from a transformer of a certain size.

Using magnetic thin films made of ferromagnetic metals with soft magnetism is advisable for iron cores in the magnetic inductive element, and making the magnetic inductive element to have a shell-type construction using the thin magnetic films for sandwiching the thin film conductor for the coil can advantageously reduce the magnetism leakage problem. In In addition, it is especially advantageous to use amorphous magnetic metals for the thin magnetic films and to cut a large number of narrow slits on the film in a direction perpendicular to the thin film conductor for the coil to reduce the high frequency loss in the magnetic circuit and to raise the high frequency characteristics of the inductance values of the magnetic inductive element.

The present invention makes it possible to reduce the size of the switching element mounted on a semiconductor chip of an integrated circuit because all the active elements including the switching element are integrated in a single semiconductor chip. Moreover, the switching frequencies can be raised beyond the conventional limit by employing a thin-film laminated structure in a magnetic inductive element in the voltage-converting section, which is indispensable for a switching power supply device, and reducing the size of the switching power supply device while solving the problems centering around the printed wiring substrates by mounting the thin voltage-converting section on the semiconductor chip of an integrated circuit via a wiring layer to arrange the section in a one-chip construction. Furthermore, the manufacture of the device can be rationalized by eliminating the parts to be mounted and device assembly.

Further, it is necessary, in addition to size reduction, to raise the conversion efficiency in a switching power supply device by suppressing high frequency losses. Since the loss in a switching element is largest among the losses in the components of the device, it is especially advantageous to split the input side of the voltage-converting section into two or more sections so that the switching element turns the input side current flowing in the split input sections on and off independently, thereby reducing the current rating for the switching element. In addition, this would raise the operating speed, so that the switching loss would be reduced.

BRIEF DESCRIPTION OF THE DRAWING

FIG. 10 is a graph showing a relationship between a parameter "k" defining a spiral shape of a thin-film coil in the thin-film transformer shown in FIG. 9 and a self-inductance L;

FIG. 11 is a graph showing a relationship between a parameter "k" defining a spiral shape of a thin-film coil in the thin-film transformer shown in FIG. 9 and a resistance R;

FIG. 12 is a graph showing a relationship between a parameter "k" defining a spiral shape of a thin-film coil in the thin-film transformer shown in FIG. 9 and a value Q.

DETAILED DESCRIPTION OF THE PREFERRED EMBODIMENTS

Figure 1A:
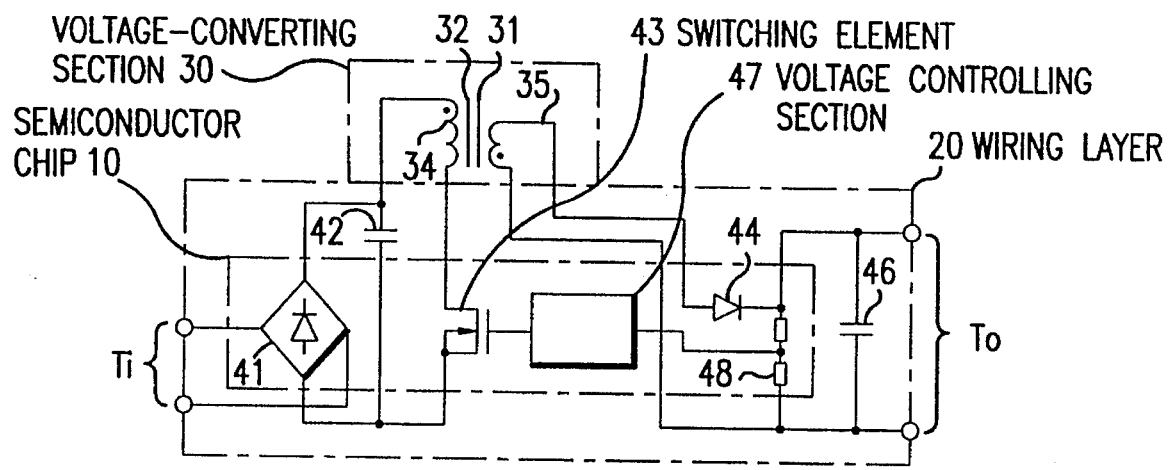
FIG. 1(a) shows a circuitry of a flyback-type power supply device of the invention.
Figure 1B:
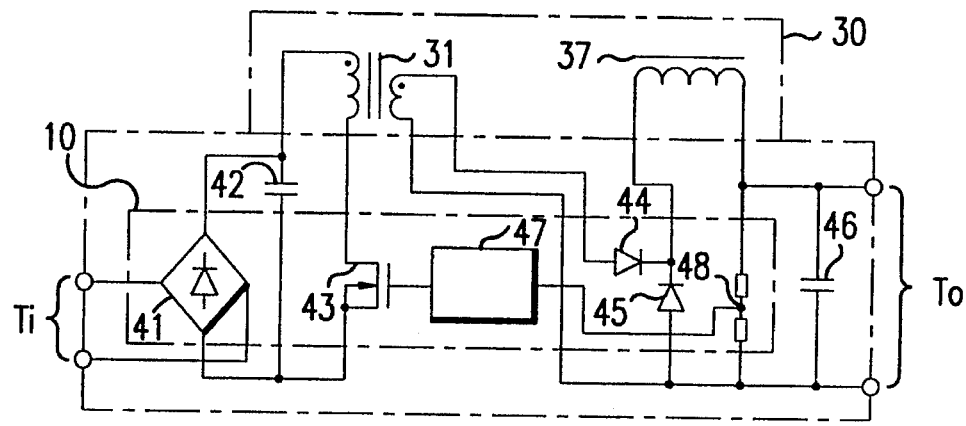
FIG. 1(b) shows a circuitry of a forward-type power supply device of the invention.
Figure 1C:
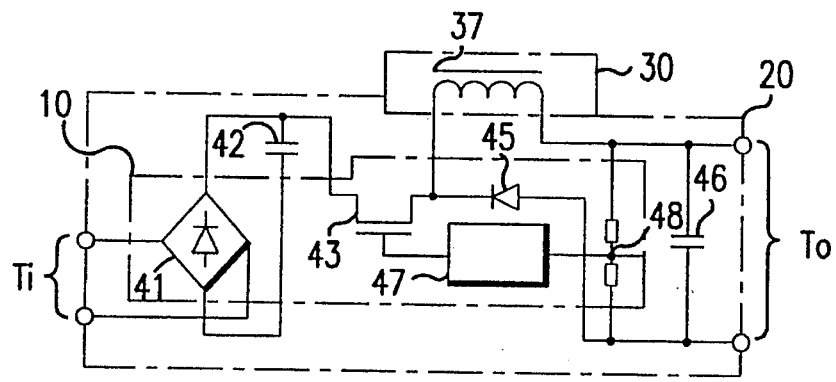
FIG. 1(c) shows a circuitry of a chopper-type power supply device of the invention.

Explanation will be made for the embodiments of the present invention with reference to the drawings. FIG. 1 illustrates the circuitries of the major circuit systems of the switching power supply devices according to the present invention, wherein FIG. 1(a) shows a flyback type, FIG. 1(b) shows a forward type, and FIG. 1(c) shows a chopper type. Although the circuitries have been well known in the art, the brief explanation is made below.

In the circuitry as shown in FIG. 1(a), a magnetic inductive element in a voltage-converting section (30) shown in the upper part of the figure is for the flyback transformer (31), wherein the present invention uses a thin magnetic film in an iron core or a magnetic circuit (32), and thin conductive films in a primary coil (34) and a secondary coil (35), respectively. In the example shown in the figure, an alternating voltage is received by the input terminal (Ti), rectified by a rectification circuit (41) and smoothed by the capacitor (42) to become a direct voltage which is then supplied to the primary coil (34) in the transformer (31). An alternating voltage generated by the secondary coil (35) in the transformer (31) is rectified by the rectification diode (44), while the current flowing through the transformer is controlled interruptively by the switching element (43) as usual. The voltage is smoothed into a stabilized direct voltage by the capacitor (46) and is then outputted from the output terminal (To) to the load.

In the present invention, insulation gate controlled semiconductors, such as field-effect transistors and insulated gate bipolar transistors, are used for the switching element (43) as shown in the figure, in which the gates are controlled by the voltage-controlling section (47) to perform switching operations. The voltage-controlling section (47) includes an oscillation circuit to determine the switching frequencies as usual, wherein frequency is 1 MHz or higher or more preferably 10 MHz or higher in the present invention. The voltage-controlling section (47) receives the actual values of the output voltage detected by the voltage-detecting circuit (48), which is formed of a pair of resistors as shown in the figure, and which plays a role in controlling the switching element (43) so that the voltage value remains at the desired value as usual, the circuit being a CMOS-type integrated circuit, for example.

The forward-type switching power circuit in FIG. 1(b) uses an ordinary transformer (31), its secondary alternating voltage being changed by a diode (44) into a direct voltage which is smoothed by a reactor (37) and a capacitor (46) before it is outputted from an output terminals (To). In this case, the diode (45) is connected to permit free wheeling.

The chopper-type power supply circuit in FIG. 1(c) uses a reactor (37) as a magnetic inductive element for a voltage-converting section (30), the stabilized direct voltage being outputted by a capacitor (46) from the output terminals (To), while the direct current flowing through the reactor (37) has its internal voltage drop controlled by turning the current on and off using the switching element (43). A diode (45) is also connected in this case to permit free wheeling.

In the above circuit systems, the chopper-type system in FIG. 1(c) has the simplest circuitry and is advantageous in making the one-chip switching power supply device, but somewhat inferior in making the output voltage constant. The forward-type system in FIG. 1(b) is best in terms of performance, but slightly disadvantageous for a one-chip construction as it requires the reactor (37) as a magnetic inductive element in addition to the transformer (31). The flyback-type system in FIG. 1(a) is excellent in terms of performance, and moreover, can eliminate the need for the reactor (37) since it utilizes the reactance possessed by the secondary coil (35) in the transformer (31) to smooth the output voltage, thereby simplifying the voltage-converting section (30) and facilitating one-chip construction. From this reason, the flyback-type switching power supply device in FIG. 1(a) offers the most advantages in the present invention.

In applying the present invention to make a one-chip switching power supply device in any one of the described circuit systems, all the active elements including the switching element (43) and the voltage-controlling section 47) are integrated into a semiconductor chip (10), which is surrounded by single-point chain lines in the figures for the sake of convenience. In the figures in which the elements are disposed on the surface of the chip, the active elements are interconnected within a wiring layer (20) indicated by a larger frame with single-point chain lines, over which the magnetic inductive elements in the voltage-converting section (30) are disposed.

There is no particular need to incorporate the rectifying circuit (41) and the capacitor (42) in the figures into the switching power supply device. Instead, a direct voltage may be supplied to the input terminals (Ti). Depending on the given circumstances, the stabilizing capacitor (46) on the output terminal (To) side may also be connected to the load side of the power supply device. When incorporating the capacitor (42) or (46) into a power supply device, it is advantageous to build it into the wiring layer (20) by utilizing the aluminum film or insulation film required for that construction.

Figure 2:
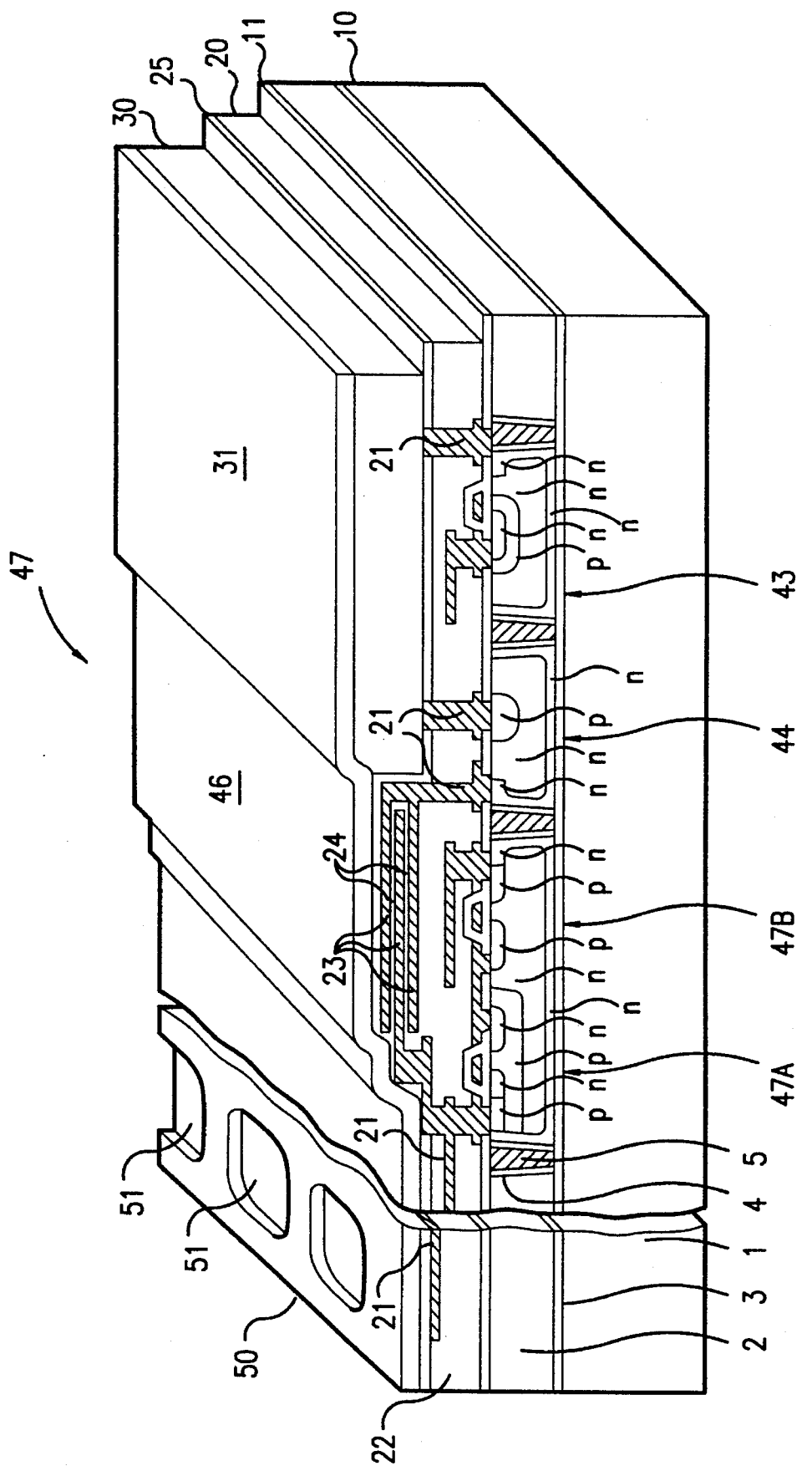
FIG. 2 shows a sectional perspective view of a part of the one-chip construction of a flyback-type switching power supply device according to the present invention.

FIG. 2 shows the one-chip construction of the switching power supply device according to the present invention as applied to a flyback-type circuit, corresponding to that shown in FIG. 1(a). As can be seen, the construction is such that the wiring layer (20) and the voltage-converting section (30) are laminated sequentially over the semiconductor chip (10) for an integrated circuit.

The semiconductor chip (10) used in the illustrated embodiment utilizes a dielectrically separated, or so called substrate-bonded wafer to prevent mutual interference when operating the active elements built into the chip. As is well known, this wafer is formed of a pair of upper and lower semiconductor substrates (1) and (2) bonded together to sandwich a silicon oxide film (3), wherein grooves are cut from the surface of the semiconductor substrate (2) deeply enough to reach the silicon oxide film (3) and split the substrate into various semiconductor regions. The groove faces are covered with the dielectric films (4) and filled with poly-crystal silicon (5), and the active elements or groups of the active elements are built into respective semiconductor regions formed by dielectrically separating the substrate (2).

FIG. 2 shows the switching element (43), the rectifying diode (44), and n- and p-channel field effect transistors (47a) and (47b) in a voltage-controlling section (47) as the representatives of the large number of active elements built into the semiconductor chip (10). The switching element (43) for the main circuit is a vertical field effect transistor, and the rectifying diode (44) also has a vertical construction. The surface of this chip (10) is covered with an inter-layer insulation film (11) made of phosphor silicate glass or the like in order to cover the poly-crystal silicon gates from above, as is usually done.

The wiring layer (20) is formed of, as usual, a multi-layer wiring structure, which is a lamination of the multi-layer wiring films (21) made of a metal, such as aluminum, that interconnects the elements 64 selectively contacting the semiconductor layers of active elements in windows opened in the inter-layer insulation film (11), and the insulation film (22) made of silicon oxide film disposed between the layers. The switching power supply device according to this embodiment is formed to slightly expand upwardly from a part of the wiring layer (20), as shown in Fig. 2, in which the capacitor (46) is built in to stabilize the output voltage. The capacitor (46) is formed of multiple layers of electrode films (23) utilizing the same aluminum films as those used in the wiring films (21), and thin dielectric films (24) made of silicon oxide and sandwiched between the electrode films (23), which are connected to the rectifying diodes (44) in the semiconductor chip (10) via the wiring films (21). Further, the uppermost layer of the wiring layer (20) is covered with an insulation film (25).

In this example of the magnetic inductive elements in the voltage-converting section (30), the flyback transformer (31) is built above the insulation film (25) in the wiring layer (20). Specific construction examples will be explained later with reference to FIG. 3, while FIG. 2 shows only its outline briefly. The surfaces of the wiring layer (20) and the voltage-converting section (30) are ultimately covered with a protection film (50) made of materials such as, for example, silicon nitride, with openings (51) at adequate locations therein while the aluminum of the wiring films (21) are exposed in the openings (51) to serve as connecting pads for the input/output terminals (Ti) and (To), as shown in FIG. 1.

Figure 3A:
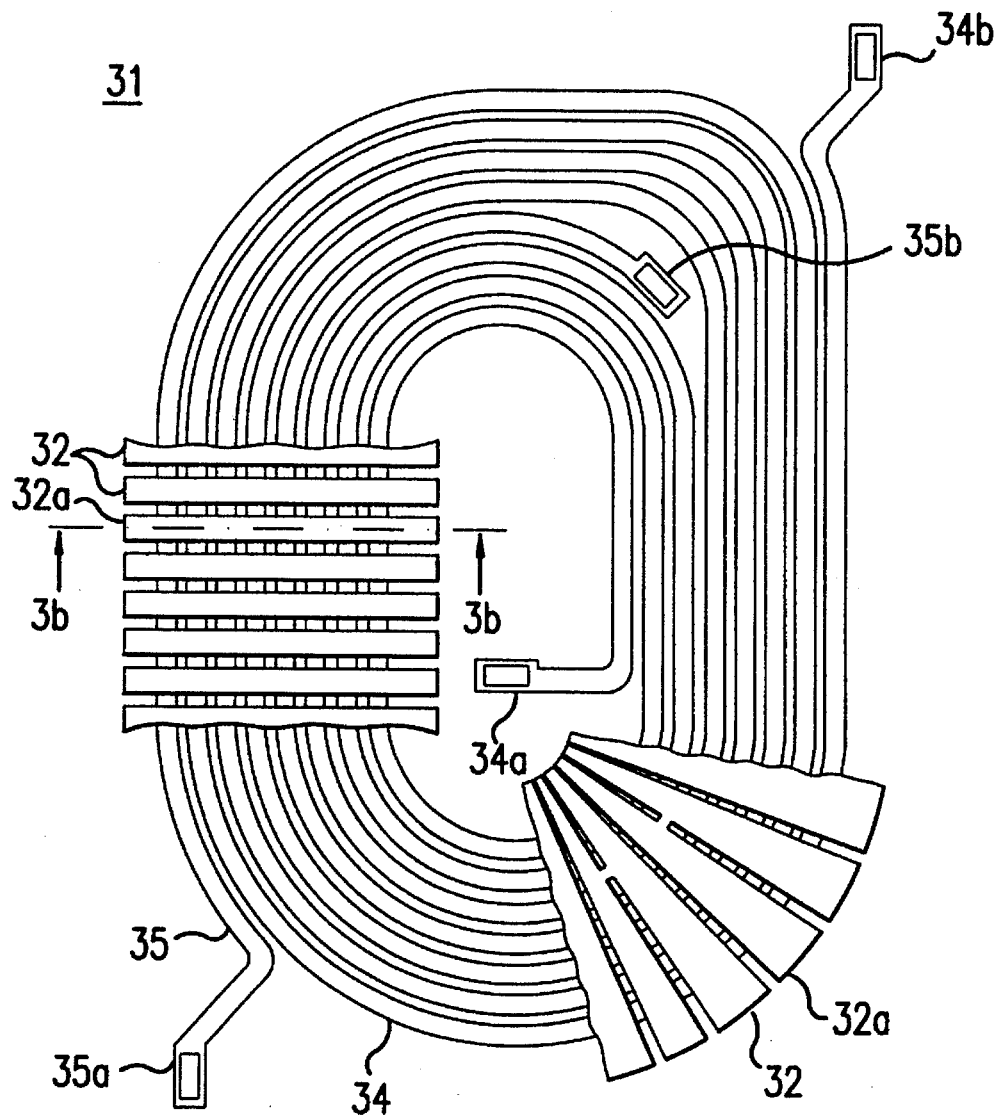
FIG. 3(a) is a partly cut top view of a thin-film laminated construction of magnetic inductive elements in a voltage-converting section referring to a flyback-type transformer.
Figure 3B:
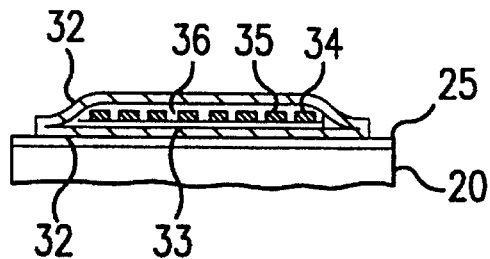
FIG. 3(b) is a section view taken along line 3(b)–3(b) of FIG. 3(a)

FIG. 3(a) shows a top view of an example of the transformer (31), and FIG. 3(b) shows a section of a line 3(b)–3(b) in FIG. 3(a). The transformer (31) illustrated in FIG. 3(b) is formed of the thin magnetic film (32) at a lower side, the insulation film (33), the primary and secondary coils (34) and (35) made of thin-film conductors, the insulation film (36) and the thin magnetic films (32) at an upper side, which are sequentially laminated over the insulation film (25) in the above-mentioned wiring layer (20) shown briefly. The transformer (31) is so-called shell-type construction, which forms a closed magnetic circuit enclosing the coils (34) and (35) from the outside using the lower and upper thin magnetic films (32).

As shown in FIG. 3(a), this embodiment has the primary coil (34) and the secondary coil (35) formed in spiral forms, wherein terminals (34a), (34b), (35a) and (35b) on both sides are connected to the switching element (43) and the diode (44) via the aluminum wiring films (21), as shown in FIG. 2. In the example shown in FIG. 3, the primary coil (34) and the secondary coil (35) are wound 6 times and 2.5 times, respectively, resulting in winding ratio of 2.4, and are connected to each other so that the coils will be wound in opposite directions.

These coils (34) and (35) are made of thin-film conductors made of high-conductive metals, such as aluminum, copper and silver, and are formed to have a thickness from several to several tens micrometers by using a sputtering process or a deposition process, to which photo etching that utilizes semiconductor manufacturing techniques is applied to give the films to have a width from several tens to 100 micrometers in a spiral pattern, as shown in FIG. 3(a).

The thin magnetic films (32) are disposed so that they cover the spiral coils (34) and (35) from above and below, while FIG. 3(a) shows only a part of them because of the illustration convenience. This thin magnetic film (32) is a ferromagnetic metal with soft magnetism, such as permalloy, made to a thin film with a thickness of ten to several tens micrometers, preferably in an amorphous state, using the sputtering process. To keep the high-frequency loss as little as possible, slits (32a) are cut in a direction perpendicular to each turn in the coils (34) and (35). These slits (32a) are spaced from ten to several tens micrometers.

Thus, in the present invention, the magnetic inductive elements has the laminated structure made of the thin magnetic films and thin conductive films, so that it is possible to reduce the internal high-frequency loss and improve the frequency characteristics in high frequency regions with switching frequency over 1 MHz to thereby provide high inductance values of about several micro H even at a high frequency of 10 MHz. Therefore, the present invention can raise the switching frequencies more than conventionally adopted frequencies, and thereby reduce the magnetic inductive element so that it can be mounted easily on a semiconductor chip (10) by reducing the size to several to 20 mm square. The total thickness of the laminated structure can be reduced to below 100 micrometers because of its thin-film construction.

The voltage-converting section (30) formed of the transformer (31) with the above-mentioned thin-film construction is, of course, mounted or incorporated on the wiring layer (20) while the semiconductor chip (10) is still in a wafer state as shown in FIG. 2, and separated into individual chips after the wafer is covered with a protective film (50). Thus, the present invention makes it possible to manufacture a one-chip switching power supply device entirely by utilizing semiconductor processing technology.

The switching power supply device according to the present invention is an extremely small one-chip device, and moreover, since the voltage-converting section (30) has already been integrated into the device, it requires no connection via a printed wiring substrate as is required in the conventional constructions. For instance, the device can be incorporated into an electronic device or an electronic circuit, while mounting on a chip and connecting to it via the connecting pads described earlier, and can then be used as it is.

Figure 4:
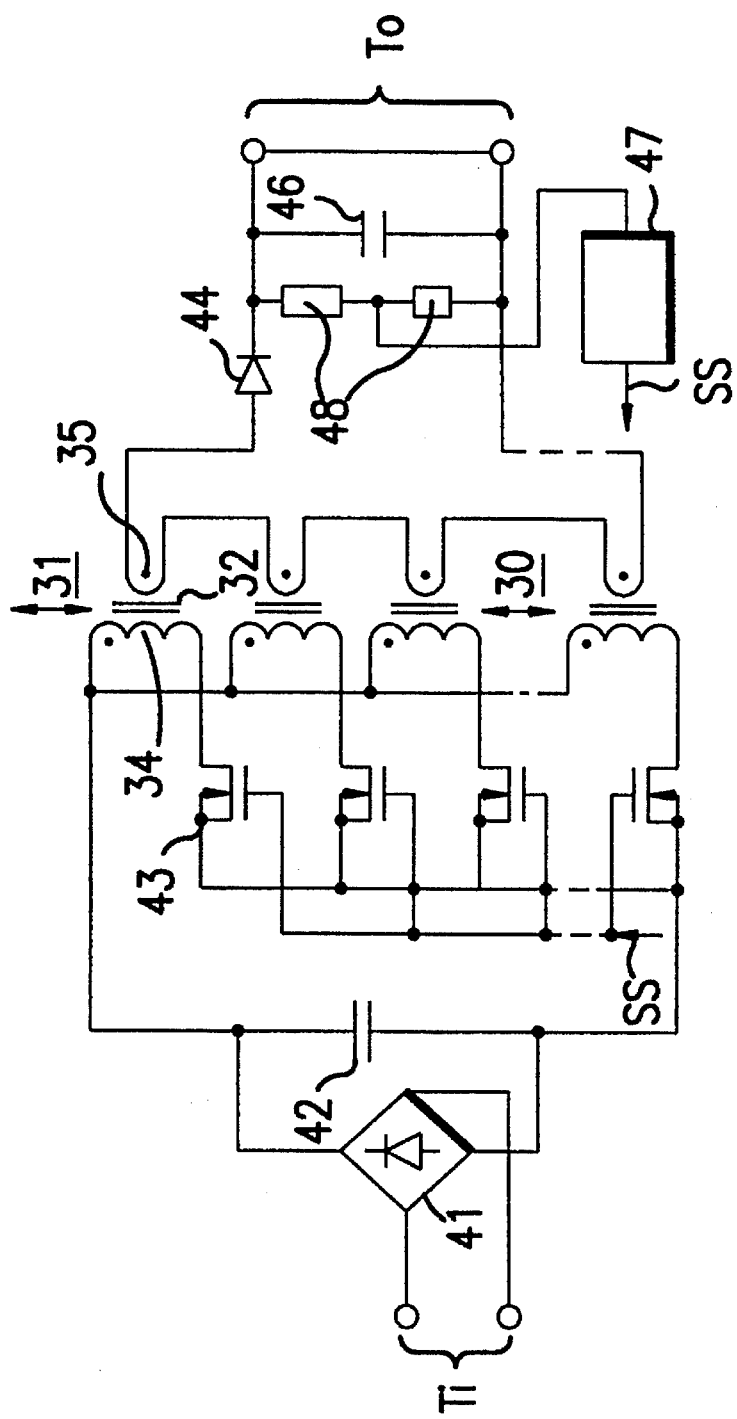
FIG. 4 is a circuit diagram for a different embodiment of the present invention, in which various switching elements and magnetic inductive elements in the voltage-converting section are disposed.

FIG. 4 shows an embodiment of the present invention, which is advantageous for reducing the loss in the switching element (43) in the form of a circuit for a flyback-type switching power supply device corresponding to that shown in FIG. 1(a). In the embodiment of the present invention, the input side in the voltage-converting section (30) is only split into various parts to have the switching element (43) to turn on and off the input-side current flowing in each split input section independently. For this purpose, the voltage converting section (30) may be constructed with a single transformer equipped with various input coils. However, in the embodiment in FIG. 4, various transformers (31), about ten transformers for example, are disposed as the magnetic inductive elements for the voltage-converting section (30) to have switching elements (43) specifically to turn the currents flowing in the primary coils (34) on and off independently.

These various primary coils (34) have a direct voltage that has been produced from an alternating voltage received at the input terminals (Ti) by using the rectifying circuit (41) and smoothed by the capacitor (42) as in the case shown in FIG. 1(a), whereas the current flowing in these parts is turned on and off simultaneously by giving a switching command (SS) from the voltage-controlling section (47) to the various switching elements (43), while the secondary coils (35) in the transformer (31) are all connected in series. This secondary alternating voltage is rectified by the rectifying diode (44) and stabilized by the capacitor (46), and then drawn out from the output terminals (To) as a direct output voltage, as in the case shown in FIG. 1(a).

In the embodiment as shown in FIG. 4, since the current to be turned on and off by the switching elements (43) is reduced by a factor of ten, the loss in each switching element (43) is reduced in proportion to this current reduction, so that the size of the element (43) can be reduced in proportion to the current reduction. Hence, its operating speed can be increased to reduce the loss associated with the on-off operation, particularly the turn-off loss that occurs nearly in proportion to the volume in a depletion layer of the semiconductor region, to an extent greater than a reduction proportional to the current reduction.

This loss-reducing effect is exhibited advantageously in frequency regions in which the switching frequency of the element (43) is higher than 1 MHz, especially in high frequency regions of 10 MHz or higher which represent the limit for the small transistors in the elements (43). As can be understood from these explanations, the embodiment in FIG. 4 is advantageous for making the switching frequency of 1 MHz or higher to reduce the size, so that the switching power supply device can be easily constructed in one chip.

Incidentally, a loss in the drive circuit relative to the switching element (43) of the output stage in the voltage-controlling section (47) tends to increase as the switching frequency rises, wherein the loss in the drive circuit at 1 MHz is about 15% of the total loss in the switching power supply device, while this ratio increases if frequency becomes higher than 1 MHz. This is because, while a drive circuit usually uses a CMOS invertor circuit to turn a pair of transistors on and off alternately, there is a time in which both transistors are in on-state to flow a short-circuit current, and the time period of the short-circuit current increases because in high frequency, the transistors fast response performance becomes insufficient resulting in an increased short-circuit loss. Therefore, as a variation of the embodiment in FIG. 4, if frequency is higher than several MHz, it is advantageous that a drive circuit is subordinated to each switching element (43) or to a group of two or three switching elements to reduce the size of the transistors in the invertor and to increase their operation speed to thereby reduce the short circuit loss in the drive circuit.

Figure 5:
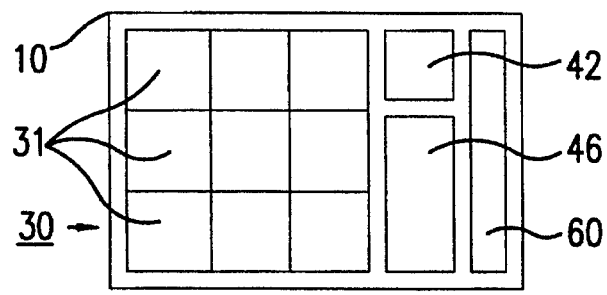
FIG. 5 is a top view of a chip showing an arrangement of various magnetic inductive elements and their related parts corresponding to the embodiment in FIG. 4.

FIG. 5 shows an example of the arrangement of the voltage-converting section (30) on the chip (10) corresponding to the circuit in FIG. 4. In the embodiment, the voltage-converting section (30) has nine transformers (31), each having 2 mm to 4 mm square and being arranged in a square form, wherein the input-side capacitor (42) and the output-side capacitor (46) are mounted on its side, and the terminal region (60) for the input terminal (Ti) and the output terminal (To) are disposed on the right-side periphery of the chip (10). As can be understood from this description, it is necessary to considerably reduce the size of each part if the voltage-converting section (30) is to be constructed with various transformers (31). A pattern advantageous for this purpose is shown in FIGS. 6(a) and 6(b) using an embodiment for the thin-film conductors in coils.

Figures 6A, 6B:
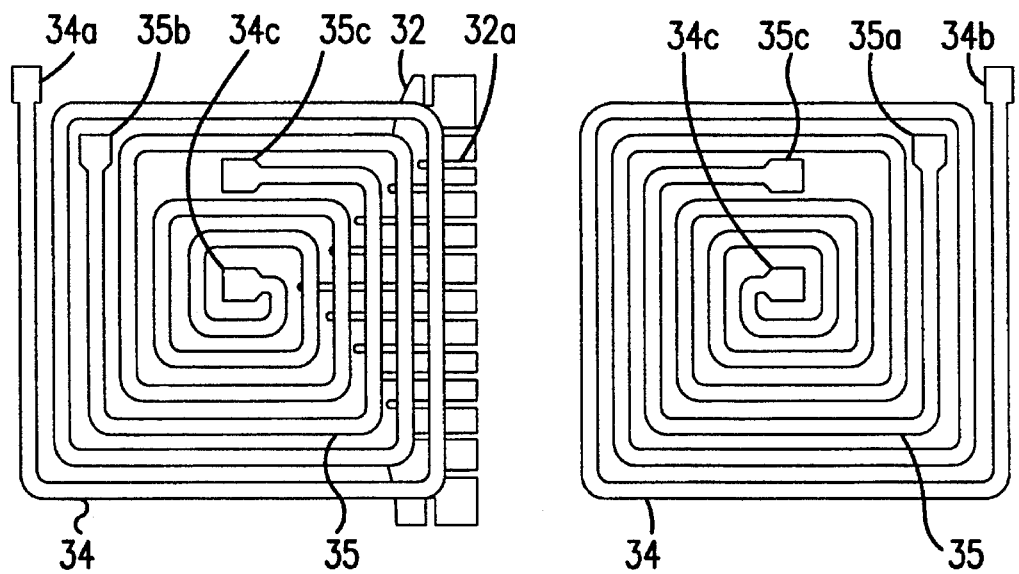
FIG. 6(a) is a top view of a lower layer of a thin-film conductor in case coils of the magnetic inductive elements in the embodiment in FIG. 4 is split into upper and lower layers.
FIG. 6(b) is a top view of an upper layer of a thin-film conductor in case coils of the magnetic inductive elements in the embodiment in FIG. 4 are split into upper and lower layers.

In the example shown in FIGS. 6(a) and 6(b), while the primary coil (34) and the secondary coil (35) in the transformer (31) are wound spirally in the same way as in FIG. 3, the thin-film conductor is split into two upper and lower layers to reduce the area, these layers being superposed one over the other and interconnected. FIG. 6(a) shows the pattern for the thin-film conductor on the lower layer, while FIG. 6(b) shows the upper layer, wherein the parts common to those in FIGS. 3(a) and 3(b) are given the same numerals.

As can be seen from FIG. 3, since it is necessary to considerably vary the number of windings in the primary coils (34) and the secondary coils (35) in each transformer (31), the thin-film conductors for the secondary coils (35) are disposed between the turns in the inner circumference and the outer circumference of the thin film conductors for the primary coils (34) to strengthen the magnetic coupling between the coils.

As shown in the drawings, the primary coil (34) is formed so that the thin-film conductor on the upper layer in FIG. 6(b) is laminated over the thin film conductors on the lower layer in FIG. 6(a), while the insulation film is disposed between these upper and lower layers. The primary coil (34) begins from the terminal (34a) at one end on the lower side in FIG. 6(a), moves over to the upper layer in FIG. 6(b) via the linking terminal (34c), and ends at the terminal (34b) on the other end, wherein the number of windings shown in the example is 9.5. Moreover, the secondary coil (35) also has a thin-film conductor on the upper layer laminated over the thin-film conductor on the lower layer. The secondary coil (35) begins from the terminal (35a) at one end on the upper side, moves over to the lower layer via the linking terminal (35c), and ends at the terminal (35b) on the other end, wherein the number of windings in the example shown is 1.5. Therefore, the ratio of the number of windings in the primary coil (34) to that in the secondary coil (35) is 6.3. However, since the transformer (31) in FIG. 3 is of a flyback type, the secondary coil (35) is connected so that its winding direction is opposite to that of the primary coil (34).

The coils (34) and (35) thus formed are sandwiched by the thin magnetic film (32), a part of which is briefly indicated in FIG. 6(a) by fine lines, in a manner similar to that shown in FIG. 3. To reduce the high frequency loss in this magnetic circuit, fine slits (32a) may be cut in the thin magnetic films (32) in a direction perpendicular to the thin-film conductors of both coils (34) and (35). By disposing the thin-film conductors in the coils (34) and (35) in two layers as shown in FIG. 6, the transformer (31) can be reduced, and by laminating the thin-film conductors of the lower and upper layers, the intersections between the thin-film conductors can be eliminated.

In addition, by providing the thin-film conductor for the secondary coil (35) having less winding than that of the coil (34) between the inner circumference and the outer circumference of the thin-film conductor for the primary coil (34), the magnetic bond between the coils (34) and (35) can be strengthened to thereby raise the output from the transformer (31) as described earlier.

Figure 7:
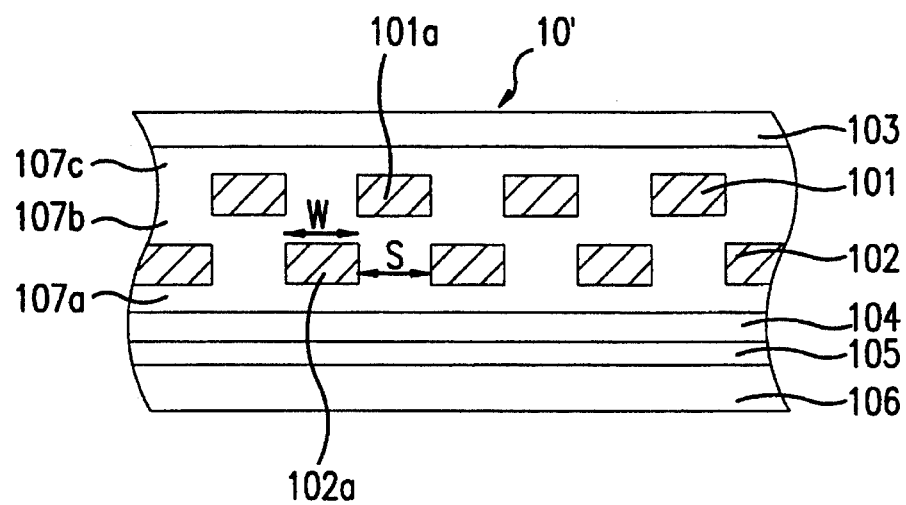
FIG. 7 is a section view for showing critical parts of a thin-film transformer according to the present invention.

FIG. 7 is a cross section showing a critical part of a thin-film transformer or thin-film magnetic element prepared in accordance with the present invention.

In FIG. 7, a thin-film transformer (10') is in the form of a semiconductor integrated device together with other transistor elements and thin-film capacitors, wherein a silicon substrate (106) is formed on its surface with a silicon oxide film (105) having a thickness of 1-2 micrometers, on an outer surface of which a magnetic film or core (104) having a thickness of 3-5 micrometers and a silicon oxide film (107a) having a thickness of 1-2 micrometers are formed. Furthermore, on the surface of the silicon oxide film (107a), a metallic film with high electric conductivity made of copper or aluminum is formed by a sputtering process or vacuum deposition process, and then the metallic film is patterned in a spiral form to form a secondary coil or a first thin-film coil (102) with a constant line width of W and a constant inter-wiring space of S.

Therefore, in the cross section, the secondary coil (102) appears to exist intermittently from its inner circumference toward the outer circumference, as shown in FIG. 7. Further, on a surface thereof, while a silicon oxide film (107b) is deposited on it, a primary coil or a second thin film coil (101) is formed in a spiral form with a constant line width of W, and a constant inter-wiring space of S. The primary coil (101) occupies the same region as the secondary coil (102) relative to the silicon substrate (106).

In this respect, the primary coil (101) is formed such that after a metallic film with high electric conductivity made of copper or aluminum is formed on the surface of the silicon oxide film (107b) by a sputtering process or a vacuum deposition process, it is patterned in a spiral form. However, the primary coil (101) is different from the spiral form of the secondary coil (102), that is, the phase of the forming cycle of the spiral form is shifted from that of the secondary coil (102), and all the wiring sections (101a) in the primary coil (101) are positioned between the wiring sections (102a) of the secondary coil (102). As a result, the wiring sections (101a) in the primary coil (101) are wound while being shifted from all the wiring sections (102a) in the secondary coil (102) in a direction toward the silicon substrate (106).

In addition, a silicon oxide film (107c) is formed on the surface side of the primary coil (101), and a magnetic film or a magnetic core (103) is formed on the surface of the silicon oxide film (107c). The silicon oxide films (107a), (107b) and (107c) have openings (not shown), which are utilized to form connecting electrodes (not shown) for connecting the primary coils (101) and the secondary coils (102) to thereby constitute the thin-film transformer (10'). For the magnetic films (103) and (104), cobalt-based or iron-based soft magnetic materials having high magnetic permeability are generally used.

In the thin-film transformer (10') with this construction, the primary coils (101) and the secondary coils (102) are formed in spiral forms, in which the phase of the forming cycle for the wiring section (101a) in the radial direction is different from the phase of forming cycle for the wiring section (102a) in the secondary coils (102) in the radial direction. Thus, all the wiring sections (101a) are completely shifted from the wiring section (102a), without expanding the area occupied by the coils on the thin-film transformer (10), and one wiring section (101a) does not face the other wiring section (102a). Therefore, the capacity of the parasitic capacitors existing between the wiring section (101a) (the primary coil (101)) and the wiring section (102a) (the secondary coil (102)) is very small. For this reason, even if thin-film transformers (10') are used in a high frequency circuit, the ratio of electric power passing through the parasitic capacitors is small, which reduces the loss.

The shift width "d" between one wiring section (101a) and the other wiring section (102a) may be set within a range of up to 0 to W (line width)+S (space between wiring sections) as in a variation of this example which will be described later.

Figure 8A:
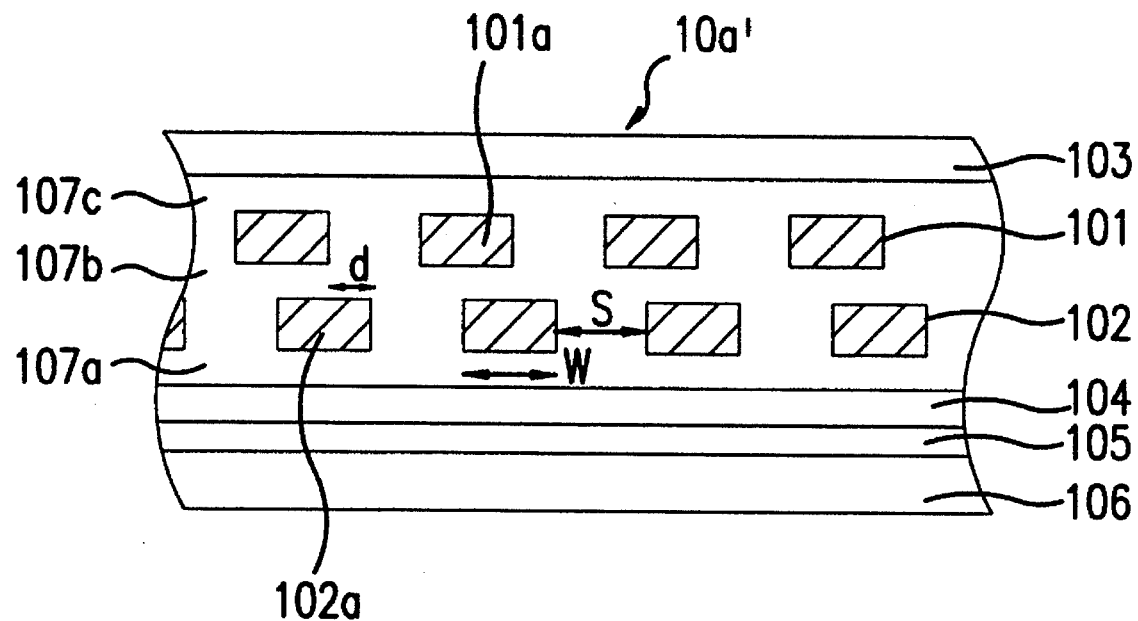
FIG. 8(a) is a section view for showing critical parts of the thin-film transformer of FIG. 7.

FIG. 8(a) is a cross section view showing a critical part of the thin-film transformer or a thin-film magnetic element according to a variation of the present invention. The thin-film transformer of this embodiment is formed with the shift width "d" of W/2, while other structures are identical to those in the thin-film transformer shown in FIG. 7. Hence the corresponding parts are given the same numerals, and their explanations are omitted.

Also in FIG. 8(a), the thin-film transformer (10a') has a magnetic film or a magnetic core (104) formed on a surface side of a silicon substrate (106) via a silicon oxide film (105), a spiral secondary coil or a first thin-film coil (102) formed on the magnetic film via a silicon oxide film (107a), a primary coil or a second thin-film coil (101) formed on the coil surface via a silicon oxide film (107b), and a magnetic film or a magnetic core (103) formed on the coil surface via a silicon oxide film (107c).

In this thin-film transformer (10a'), the primary coil (101) and the secondary coil (102) are formed in the spiral forms, in which the phase of the forming cycle for the wiring section (101a) in the radial direction is different from the phase of the forming cycle for the other wiring section (102a) in the secondary coil (102) in the radial direction. Thus, the entire wiring section (101a) is shifted from other wiring section (102a) with a distance of W/2, and these wiring sections do not completely face with each other.

Therefore, the capacity of the parasitic capacitors connected to one wiring section (101a) or the primary coil (101) and the other wiring section (102a) or the secondary coil (102) is small, which serves to reduce power losses as well as other losses. Moreover, since one wiring section (101a) or the primary coil (101) and the other wiring section (102a) or the secondary coil (102) partially face with each other, coefficient of the coupling between the primary coil (101) and the secondary coil (102) is at a relatively high level.

Figure 8B:
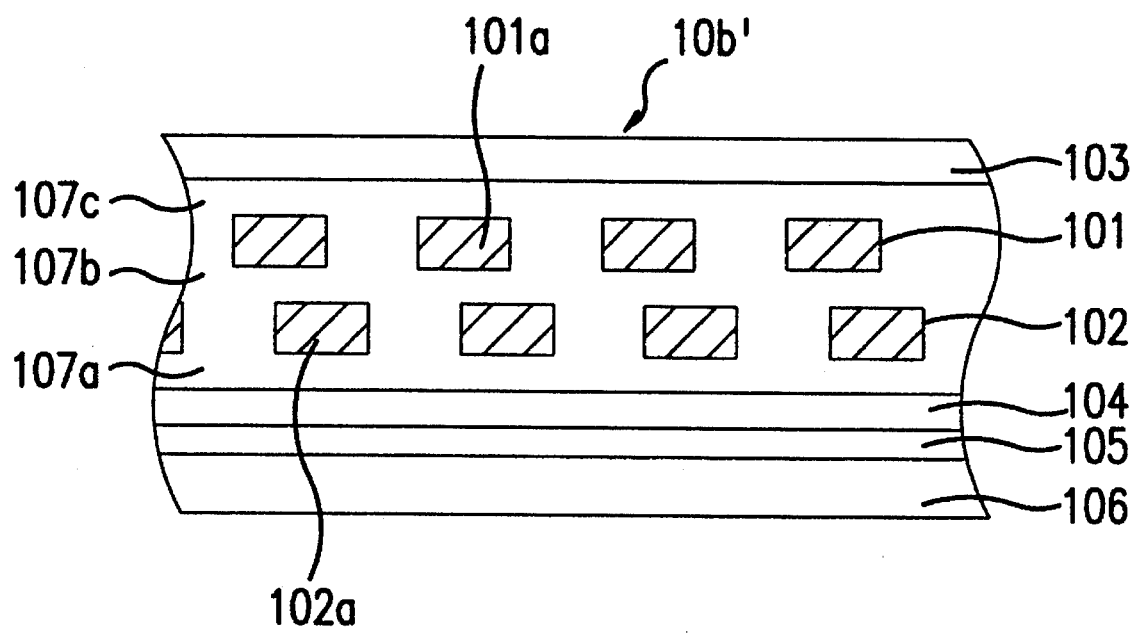
FIG. 8(b) is a section view for showing critical parts of the thin-film transformer according to another version of FIG. 7.

Therefore, it is possible to selectively form the thin-film transformer (10') according to the first embodiment or the thin-film transformer (10a') of this embodiment, or the thin-film transformer (10b') and the like, which has a shift width "d" of 3W/4 between the wiring section (101a) and the wiring section (102a) as shown in FIG. 8(b) as another variation of the first embodiment, and which is an intermediate construction between the thin-film transformer (10') and the thin-film transformer (10a'). The transformer can be made according to the frequency levels in the circuit in which the thin-film transformer is used. Therefore, it is possible to set the capacities of the parasitic capacitors and coupling coefficient to match the circuits. As a result, it becomes possible to design the circuit in a wide variety of ways.

Figure 9:
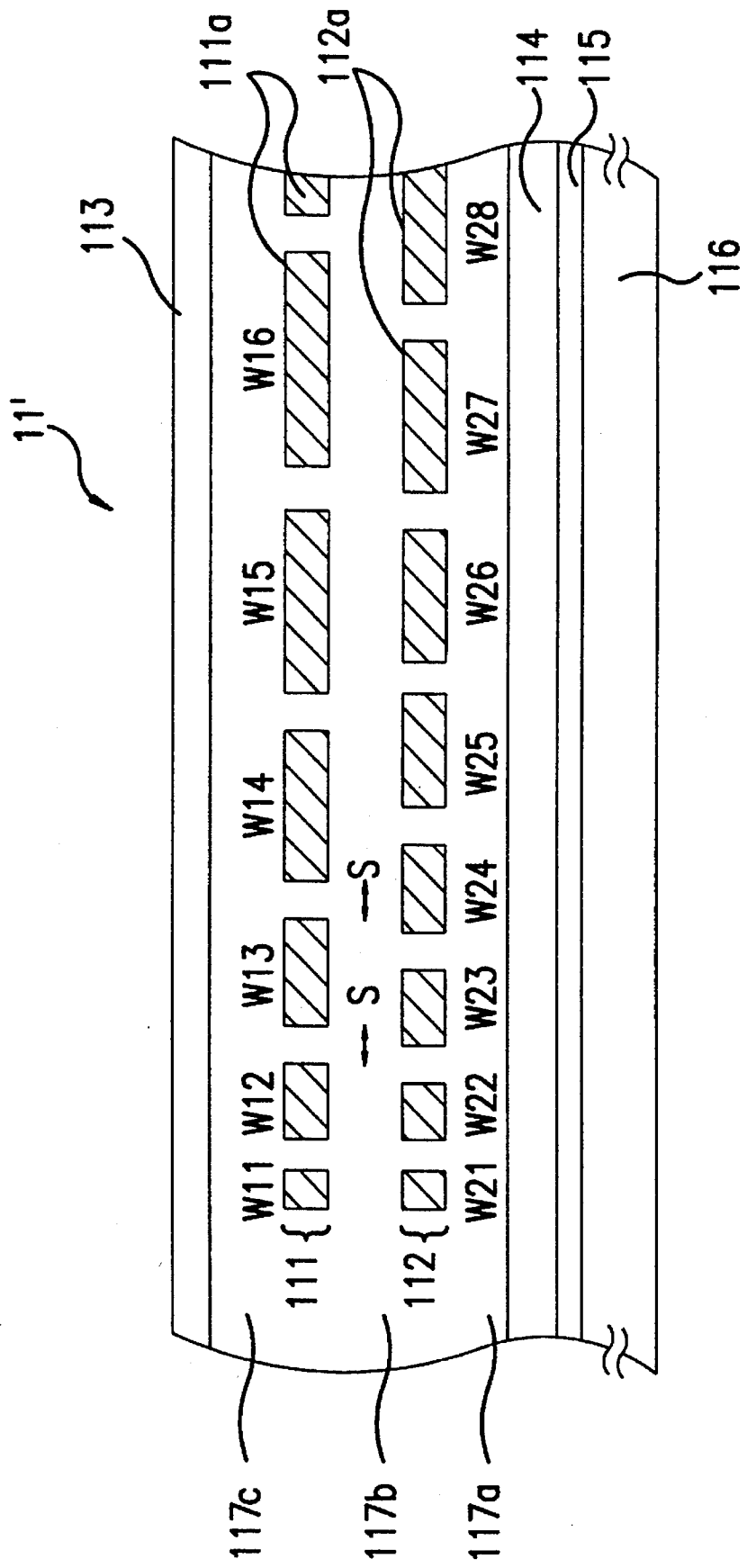
FIG. 9 is a section view for showing critical parts of the thin-film transformer according to a different embodiment of FIG. 7.

FIG. 9 is a cross section view showing a critical part of a thin-film transformer or thin-film magnetic element according to a second embodiment of the present invention.

In FIG. 9, also, a thin-film transformer (11') has a magnetic film or a magnetic core (114) having a thickness of 3-5 micrometers and formed on a surface side of the silicon substrate (116) via a silicon oxide film (115) having a thickness of 1-2 micrometers, a secondary coil (112) formed on the magnetic film surface via a silicon oxide film (117a) having a thickness of 1-2 micrometers, a primary coil (111) formed on the secondary coil surface via a silicon oxide film (117b), and a magnetic film (113) formed on the primary coil surface side via a silicon oxide film (117c). Also, in this thin-film transformer (11'), after both the primary coil (111) and the secondary coil (112) are formed of a film made of metallic material with high electric conductivity, such as copper or aluminum, by using a sputtering process or a vacuum deposition process, they are patterned in spiral forms.

When patterning the metallic film made of copper or aluminum to form the primary coil (111) or the secondary coil (112) in this embodiment, both the primary coil (111) and the secondary coil (112) are formed in spiral forms, and the line width in each coil varies from the inner circumference to the outer circumference. Each coil is wound twenty times, and has an innermost circumference radius of about 500 micrometers, an outermost circumference radius of about 5000 micrometers, a space between the wiring of about 5 micrometer, and a thickness of about 5 micrometers.

In addition, the line width of the wiring section (111a) in the primary coil (111) becomes wider from the inner circumference to the outer circumference as $W_{11}$, $W_{12}$ ... $W_{14}$, $W_{15}$, and the line width of the wiring section (112a) in the secondary coil (112) also becomes wider from the inner circumference to the outer circumference as $W_{21}$, $W_{22}$ ... $W_{27}$, $W_{28}$. Because the primary coil (111) and the secondary coil (112) are constructed so that their line width changing rates from the inner circumference to the outer circumference are different from each other, and therefore, the wiring section (111a) and the wiring section (112a) are staggered, and these sections do not face each other exactly. Thus, the capacity of the parasitic capacitors existing between one wiring section (111a) or the primary coil (111) and the other wiring section (112a) or the secondary coil (112) is very small, which serves to reduce the power loss.

Moreover, since one wiring section (111a) or the primary coil (111) and the other wiring section (112a) or the secondary coil (112) partially face to each other, the coefficient of the coupling between the primary coil (111) and the secondary coil (112) is relatively high. Therefore, by optionally setting the line width changing rates from the inner circumference to the outer circumference in the primary coil (111) and the secondary coil (112) according to the frequency levels at which the thin-film transformer is used in the circuit, the relation between the coupling coefficient and the parasitic capacitance can be set to a level corresponding to the circuits, which allows the circuit to be designed in a wide variety of ways.

Furthermore, in the thin-film transformer (11') shown in this example, the primary coil (111) and the secondary coil (112) take spiral forms and the line width changing rates from the inner circumference to the outer circumference differ from each other. Therefore, if the coil drawn from the inner circumference is assumed to be wound "n" times (provided "n" is an integer larger than 2), the line widths $W_{m,n}$ in both coils are expressed in $W_{m,n}=W(n)$ as a function of "n", and if the circumferential lengths are assumed to be $C_{m,n}$ the circumferential lengths $C_{m,n}$ are expressed by $C_{m,n}=C(n)$ as a function of "n". The suffix "m" indicates the side of the coil. Therefore, when the spiral form of each coil is shown by the relationship of the circumferential lengths $C_{m,n}$ to the line widths $W_{m,n}$ at the "n"th round of the coil from the inner circumference and the relationship of the circumferential lengths $C_{m,n}-1$ to the line widths $W_{m,n}-1$ at the "n–1th" round, the following expression can be used.

$$(C_{m,n}/W_{m,n})=k \cdot (C_{m,n-1}/W_{m,n-1})$$

Accordingly, by varying "k" as a parameter to define the spiral shape in the above general expression from 0.75 to 1.25, the thin-film coils of different spiral shapes were formed to determine the relationship between the parameter "k" and the resistance (R) in each thin-film coil, and the relationship of the parameter "k" to the self-inductance L and Q values (omega L/R). The relationship between the parameter "k" and the spiral shapes may be described as follows. If "k" is large, extent of expansion of the line width $W_{m,n}$ is also large as the spiral moves from the inner circumference to the outer circumference when comparing expansion of the circumferential length $C_{m,n}$. Conversely, if "k" is small, extent of expansion of the line width $W_{m,n}$ is also small as the spiral moves from the inner circumference to the outer circumference when comparing expansion of the circumferential length $C_{m,n}$. Therefore, if k=1, extension in the circumferential length $C_{m,n}$ causes the line width $W_{m,n}$ to be expanded at the same ratio. If "k" is larger than one, the line width $W_{m,n}$ on the outer circumference necessarily takes an expanded spiral shape.

Among the results of the discussions on each thin film coil with a spiral shape as defined by the "k", FIG. 10 shows the relationship between the "k" and the self-inductance (L), while FIG. 11 shows the relationship between the "k" and the resistance (R) in the thin-film coil, and FIG. 12 shows the relationship between the "k" and the Q value (omega L/R) in the thin-film coil.

As a result, as shown by the solid line (21) in FIG. 10, in the relationship between "k" and the self-inductance in the thin-film coil, if "k" takes a small value, the coils are arranged more closely to each other because the line width W is reduced at the outer circumference having a greater circumferential length to contribute largely to the self-inductance. Hence, the self-inductance is increased. On the other hand, if the "k" takes a large value, the self-inductance decreases.

Meanwhile, as shown by the solid line 22 in FIG. 11, in the relationship between "k" and the parasitic resistance R in the thin-film coil, if "k" takes a value of I and the spiral shape is assumed to be a concentric shape while all the circumferences are assumed to be connected electrically in series, then the change rate of the ratio of the circumferential length $C_{m,n}$ to the line width $W_{m,n}$ is in a state close to a value of 1 on any circumference, that is, a state in which the resistance values are equivalent. Therefore, the resistance R can be minimized when the value "k" is approximately one, and near the vicinity thereof, the resistance can be reduced to about 80% of what it is in the conventional thin-film coils to thereby reduce the losses attributable to the resistance R parasitic to the thin-film coils.

As a result, and as shown by the solid line 23 in FIG. 12, in the relationship between "k" and the value Q (omega L/R), when "k" takes a value of about 0.92, the value Q is maximized, and is optimised as the thin-film coil. Moreover, by setting the value "k" in a range from about 0.8 to about 1.2, that is, a range in which the ratio of the circumferential length to the line width at "n"th round from the inner circumference in a radial direction of the thin-film coil is about 0.8 times to about 1.2 times of the ratio of the circumferential length to the line width of the "n–1"th round, the value Q in the magnetic coil is optimised.

Therefore, according to this structure, by varying the value "k" in the primary coil (111) and the secondary coil (112) as in the thin-film transformer (11'), the capacity of the parasitic capacitors across the wiring section (111a) or the primary coil (111) and the wiring section (112a) or the secondary coil (112) can be reduced. In addition, by setting the value "k" to a range between 0.8 and 1.2, it becomes possible to ensure a high Q value for the primary coil (111) and the secondary coil (112).

While this example has been explained where a thin-film coil having the above-mentioned spiral shape is used for a thin-film transformer (11'), the structure should not be limited to this embodiment, and the thin-film coil may be applied to a thin-film inductor to produce a thin-film inductor with a large Q value.

Figure 13:
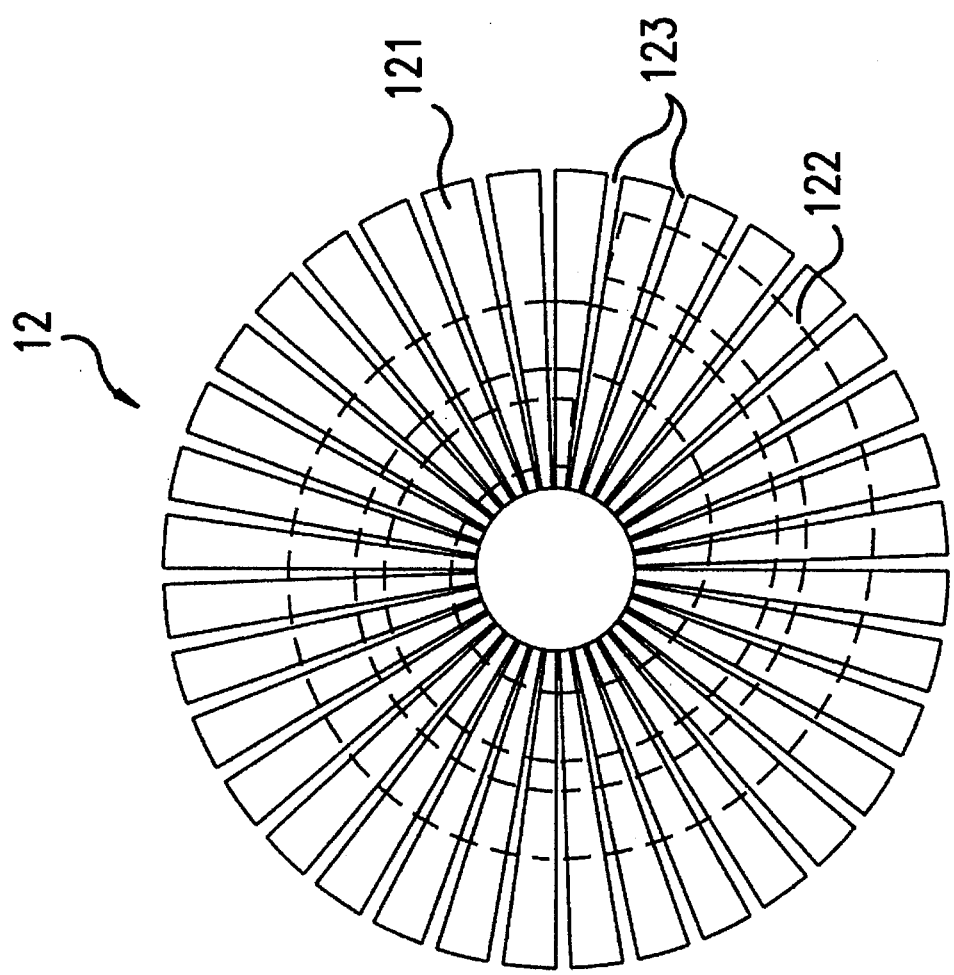
FIG. 13 is a plan view showing critical parts of a thin-film inductor according to a different embodiment of the present invention.

FIG. 13 is a cross section view showing a critical part of a thin-film inductor or a thin-film magnetic element according to the third embodiment of the present invention.

In FIG. 13, a thin-film inductor (12) has a thin-film coil (122) made of electrically conductive materials in a spiral shape formed on the surface of the inductor via an insulation film, and a magnetic film (121) or a magnetic core formed on the surface of the thin-film coil (122), wherein this magnetic film (121) is divided equally by magnetic film non-forming regions (123) disposed radially from a position corresponding to the inner circumference of the thin-film coil (122) to the outer circumference.

In the thin-film inductor (12) with this structure, since the magnetic film (121) is divided equally in the circumferential direction such that a position corresponding to the inner circumference of the thin-film coil (122) is centered, even if an eddy current is generated as a result of the magnetic induction of the magnetic film (121), the path for the eddy current is separated. As a result, the eddy current is reduced, resulting in a reduced loss or eddy current loss in the thin-film inductor (12).

The first embodiment through the third embodiment for the typical thin-film magnetic elements have been explained, whereas these techniques may be applied also to a magnetic head in addition to the thin-film transformer or the thin-film inductor. Furthermore, in constructing these thin-film magnetic elements, the structures shown in the first embodiment through the third embodiment may be combined.

On the other hand, the switching power supply device as described before is particularly suitable for mass production of stabilized power supply devices, which have relatively small capacities from 1 W to about 10 W. As a result, in the present invention, it is possible to provide at reduced cost a one-chip switching power supply device extremely small in size, which is easy to incorporate into various kinds of electronic circuits by using a switching frequency from 1 MHz to 10 MHz with a chip size from several to 20 mm square, a thickness of 1 mm or less and a conversion efficiency of between 70% and 80%. Further, the size reduction may be expected as a result of further improvement in the future as the switching frequency is raised.

In the present invention as described above, the one-chip switching power supply device is constructed in such a manner that the magnetic inductive elements in the voltage-converting section are of thin-film structures, all the active elements including the switching elements to turn the input-side current in the magnetic inductive elements on and off and the voltage-controlling section to intermittently control the switching elements so that the output-side current is kept constant are incorporated into a single semiconductor chip, and the wiring layers that interconnect the active elements and the voltage-converting section are laminated sequentially on the chip. As a result, the following effects can be obtained.

(a) To reduce the high-frequency loss, the magnetic inductive elements is made to have the thin-film structure in the voltage-converting section, which is indispensable in a switching power supply device, so that frequency characteristics of the inductance values can be improved, and the size of the elements can be reduced to be small enough to be mounted on a semiconductor chip. Hence, the switching power supply device can be remarkably reduced in size by adopting such a one-chip structure.

(b) Since the voltage-converting section is mounted on a semiconductor chip integrating the active elements via the wiring layers and is connected to the chip, problems, such as performance variance which usually occurs in conventional printed wiring substrates, and mal-operations which are caused by incoming noise, are all eliminated, and the switching power supply device with highly uniform performance of the elements and high reliability can be provided.

(c) Since the switching power supply device can be manufactured entirely by utilizing the semiconductor processing technologies without the need to assemble the device or mount the parts, mass production is facilitated, and manufacturing costs are greatly reduced as a result of the rationalized manufacturing processes.

(d) Since the switching frequencies can be raised beyond the conventional limits by forming the magnetic inductive elements with the thin films, the electrostatic capacity of a capacitor can be reduced even when it is incorporated into the switching power supply device. As a result, the device is very small.

(e) In the embodiment wherein the input-side current is independently turned on and off by the switching element, by dividing the input side of a voltage-converting section or by providing a plurality of magnetic inductive elements, it is possible to raise the operation speed by reducing the current flowing in each switching element, to improve the conversion efficiency by reducing losses associated with the on-off operations, and to further reduce the size of the switching power supply device by raising the switching frequencies.

In addition, in the thin film magnetic elements according to the present invention, it is important that the first thin-film coil is shifted from the second thin-film coil, for example, the first thin-film coil is spiral-shaped with the line width changing rate to be different from that for the second thin-film coil. Therefore, according to the present invention, the first thin-film coil and the second thin film coil do not exactly face to each other, so that the capacity of the parasitic capacitors existing between these coils is small. Hence, the ratio of electric power passing through the parasitic capacitors is low, even when the thin-film magnetic elements are used in high-frequency circuits, and as a result, losses can be reduced without expanding the areas to be occupied by the thin-film magnetic elements.

Furthermore, in the case where the spirally shaped thin-film coil is arranged so that the ratio of the circumferential length to a line width in the "n"th round from the inner circumference to the radial direction is within a range of about 0.8 to 1.2 times of the ratio of the circumferential length to a line width in the "n–1"th round, the resistance values are the same on any point on the coil. Therefore, the entire resistance value in a thin-film coil corresponding to a state in which each resistor is connected in series comes close to a minimum value, losses attributable to the resistance in the thin-film coil can be reduced without expanding the areas occupied by the thin film magnetic elements.

Furthermore, in case where the magnetic film as a magnetic core is split into various regions, an eddy current, even if generated by magnetic induction, can be reduced because a path for the eddy current flowing through the magnetic film is divided. Thus, the eddy current loss can be reduced.

What is claimed is:

1. A thin-film magnetic element comprising:

a substrate with a surface, a first thin film coil made of a conductive material and formed in a spiral shape on the surface of the substrate parallel thereto, and a second thin-film coil made of a conductive material and formed in a spiral shape on the first thin-film coil parallel to the substrate, said first thin-film coil and said second thin-film coil occupying nearly a same position relative to said substrate surface, each of said first and second thin film coils changing a line width from an inner circumference to an outer circumference, a changing ratio of the line width at the first thin film coil being different from that at the second thin film coil, said spiral shapes of said first and second thin-film coil being shifted slightly away from each other in a direction parallel to the substrate surface.

2. A thin-film magnetic element as claimed in claim 1, further comprising insulation films situated between the substrate and the first thin film coil and between the first and second thin-film coils.

3. A thin-film magnetic element comprising:

a substrate, and a thin-film coil made of a conductive material and formed on the substrate to be parallel thereto, said thin-film coil being formed in a spiral shape so that a line width changes from an inner circumference to an outer circumference, and a ratio of a circumferential length to the line width in a radial direction at "n"th round from the inner circumference is within a range of about 0.8 to 1.2 times of a ratio of the circumferential length to the line width in a "n−1"th round, wherein "n" is an integer larger than two.

4. A thin-film magnetic element comprising:

a substrate, a magnetic core made of a magnetic film and disposed on the substrate, said magnetic core being divided into a plurality of regions, and a thin-film coil made of a conductive material and formed in a spiral form on the magnetic core parallel to the substrate, said magnetic core being radially divided so that an inner end of the thin-film coil is a center of the regions.

5. A thin-film magnetic element as claimed in claim 4, further comprising insulation films, said insulating films being disposed between the substrate and the magnetic core and between the magnetic core and the thin-film coil.

* * * * *